(12) United States Patent
Hoang et al.

(10) Patent No.: US 7,436,228 B1
(45) Date of Patent: Oct. 14, 2008

(54) VARIABLE-BANDWIDTH LOOP FILTER METHODS AND APPARATUS

(75) Inventors: Tim Tri Hoang, San Jose, CA (US); Sergey Shumarayev, San Leandro, CA (US); Wilson Wong, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 58 days.

(21) Appl. No.: 11/317,126

(22) Filed: Dec. 22, 2005

(51) Int. Cl.
*H03K 5/00* (2006.01)
*H03L 7/06* (2006.01)

(52) U.S. Cl. .................. 327/157; 327/152; 327/158; 327/558; 327/553

(58) Field of Classification Search ......... 327/156–158, 327/147–149, 552, 558, 553
See application file for complete search history.

(56) References Cited

U.S. PATENT DOCUMENTS

| | | | |
|---|---|---|---|
| 3,473,160 A | 10/1969 | Wahlstrom | |
| 4,494,021 A | 1/1985 | Bell et al. | |
| 4,633,488 A | 12/1986 | Shaw | |
| 4,719,593 A | 1/1988 | Threewitt et al. | |
| 4,857,866 A | 8/1989 | Tateishi | |
| 4,868,522 A | 9/1989 | Popat et al. | |
| 4,959,646 A | 9/1990 | Podkowa et al. | |
| 5,072,195 A | 12/1991 | Graham et al. | |
| 5,075,575 A | 12/1991 | Shizukuishi et al. | |
| 5,079,519 A | 1/1992 | Ashby et al. | |
| 5,121,014 A | 6/1992 | Huang | |
| 5,133,064 A | 7/1992 | Hotta et al. | |
| 5,204,555 A | 4/1993 | Graham et al. | |
| 5,208,557 A | 5/1993 | Kersh, III | |
| 5,239,213 A | 8/1993 | Norman et al. | |
| 5,272,452 A * | 12/1993 | Adachi et al. ................. 331/17 |
| 5,349,544 A | 9/1994 | Wright et al. | |
| 5,394,116 A | 2/1995 | Kasturia | |
| 5,397,943 A | 3/1995 | West et al. | |

(Continued)

FOREIGN PATENT DOCUMENTS

EP  0 266 065  5/1988

(Continued)

OTHER PUBLICATIONS

Advanced Micro Devices, Inc., "AM2971 Programmable Event Generator (PEG)," Publication No. 05280, Rev. C, Amendment /0, pp. 4-286-4-303 (Jul. 1986).

(Continued)

*Primary Examiner*—Dinh T. Le
(74) *Attorney, Agent, or Firm*—Ropes & Gray LLP; Robert R. Jackson; Chia-Hao La

(57) ABSTRACT

Methods and apparatus are provided for varying the bandwidth of a loop filter in a loop circuit (e.g., a phase-locked loop circuit). The loop filter can include first and second resistor circuitries coupled to a capacitor. One of the resistor circuitries can be coupled to an output of the loop circuit in response to selection of a mode of operation. The resistor circuitries can each include a plurality of resistors that can be selectively coupled in series to the capacitor or bypassed. In addition, the output of the loop circuit can be coupled to a second capacitor. Either or both of the capacitors can be programmable.

16 Claims, 3 Drawing Sheets

U.S. PATENT DOCUMENTS

| | | | |
|---|---|---|---|
| 5,416,438 A * | 5/1995 | Shibata | 327/552 |
| 5,418,499 A | 5/1995 | Nakao | |
| 5,420,544 A | 5/1995 | Ishibashi | |
| 5,424,687 A | 6/1995 | Fukuda | |
| 5,448,191 A | 9/1995 | Meyer | |
| 5,477,182 A | 12/1995 | Huizer | |
| 5,506,878 A | 4/1996 | Chiang | |
| 5,542,083 A | 7/1996 | Hotta et al. | |
| 5,581,214 A | 12/1996 | Iga | |
| 5,629,651 A | 5/1997 | Mizuno | |
| 5,642,082 A | 6/1997 | Jefferson | |
| 5,646,564 A | 7/1997 | Erickson et al. | |
| 5,656,959 A | 8/1997 | Chang et al. | |
| 5,691,669 A | 11/1997 | Tsai et al. | |
| 5,699,020 A | 12/1997 | Jefferson | |
| 5,742,180 A | 4/1998 | DeHon et al. | |
| 5,744,991 A | 4/1998 | Jefferson et al. | |
| RE35,797 E | 5/1998 | Graham et al. | |
| 5,777,360 A | 7/1998 | Rostoker et al. | |
| 5,815,016 A | 9/1998 | Erickson | |
| 5,847,617 A | 12/1998 | Reddy et al. | |
| 5,889,436 A | 3/1999 | Yeung et al. | |
| 5,900,757 A | 5/1999 | Aggarwal et al. | |
| 5,952,891 A | 9/1999 | Boudry | |
| 5,963,069 A | 10/1999 | Jefferson et al. | |
| 5,970,110 A | 10/1999 | Li | |
| 5,974,105 A | 10/1999 | Wang et al. | |
| 5,987,543 A | 11/1999 | Smith | |
| 5,999,025 A | 12/1999 | New | |
| 6,014,048 A | 1/2000 | Talaga, Jr. et al. | |
| 6,043,677 A | 3/2000 | Albu et al. | |
| 6,069,506 A | 5/2000 | Miller, Jr. et al. | |
| 6,069,507 A | 5/2000 | Shen et al. | |
| 6,104,222 A | 8/2000 | Embree | |
| 6,114,915 A | 9/2000 | Huang et al. | |
| 6,141,394 A | 10/2000 | Linebarger et al. | |
| 6,144,242 A | 11/2000 | Jeong et al. | |
| 6,157,266 A | 12/2000 | Tsai et al. | |
| 6,157,271 A * | 12/2000 | Black et al. | 332/127 |
| 6,249,189 B1 | 6/2001 | Wu et al. | |
| 6,252,419 B1 | 6/2001 | Sung et al. | |
| 6,278,332 B1 | 8/2001 | Nelson et al. | |
| 6,320,469 B1 | 11/2001 | Friedberg et al. | |
| 6,373,278 B1 | 4/2002 | Sung et al. | |
| 6,373,304 B1 * | 4/2002 | Drost et al. | 327/157 |
| 6,380,800 B1 * | 4/2002 | Huber | 327/552 |
| 6,389,092 B1 * | 5/2002 | Momtaz | 375/376 |
| 6,411,150 B1 | 6/2002 | Williams | |
| 6,462,623 B1 | 10/2002 | Horan et al. | |
| 6,483,886 B1 | 11/2002 | Sung et al. | |
| 6,642,758 B1 | 11/2003 | Wang et al. | |
| 6,747,497 B2 * | 6/2004 | Ingino, Jr. | 327/157 |
| 6,856,180 B1 * | 2/2005 | Starr et al. | 327/147 |
| 6,924,678 B2 | 8/2005 | Starr | |
| 2001/0033188 A1 | 10/2001 | Aung et al. | |

FOREIGN PATENT DOCUMENTS

| | | |
|---|---|---|
| EP | 0 416 930 | 3/1991 |
| EP | 0 778 517 | 6/1997 |
| EP | 0 987 822 | 3/2000 |
| EP | 1 056 207 | 11/2000 |
| JP | 1137646 | 5/1989 |
| JP | 10215156 | 8/1998 |

OTHER PUBLICATIONS

Advanced Micro Devices, Inc., "AmPAL*23S8 20-Pin IMOX PAL-Based Sequencer," Publication No. 06207, Rev. B, Amendment /0, pp. 4-102-4-121 (Oct. 1986).

Agere Systems, Inc., "ORCA ORT82G5 0.622/1.0-1.25/2.0-2.5/3.125 Gbits/s Backplane Interface FPSC," Preliminary Data Sheet, pp. 1-35 (Jul. 2001).

Agere Systems, Inc., "ORCA 8850 Field-Programmable System Chip (FPSC) Eight Channel×850 Mbits/s Backplane Transceiver," Product Brief, pp. 1-6 (Jul. 2001).

Agere Systems, Inc., "ORCA 8850 Field-Programmable System Chip (FPSC) Eight Channel×850 Mbits/s/ Backplane Transceiver," Product Brief, pp. 1-36 (Aug. 2001).

DynaChip Corp., "Application Note: Using Phase Locked Loops in DL6035 Devices" (1998).

DynaChip Corp., DY6000 Family Datasheet (Dec. 1998).

Ko, U., et al., "A 30-ps Jitter, 3.6 ẏs locking, 3.3-Volt Digital PLL for CMOS Gate Arrays," Proceedings of the IEEE 1993 Custom Integrated Circuits Conference, Publication No. 0-7803-0826-3/93, pp. 23.3.1-23.3.4 (May 9-12, 1993).

LSI Logic Corp., 500K Technology Design Manual (Document DB04-000062-00, First Edition), pp. 8-1-8-33 (Dec. 1996).

Lucent Technologies, Inc., Optimized Reconfigurable Cell Array (ORCA®) OR3Cxxx/OR3Txxx Series Field-Programmable Gate Arrays, Preliminary Product Brief, (Nov. 1997).

Lucent Technologies, Inc., ORCA® Series 3 Field-Programmable Gate Arrays, Preliminary Data Sheet, Rev. 01 (Aug. 1998).

Monolithic Memories, Inc., "Programmable Array Logic PAL20RA10-20 Advance Information," pp. 5-95-5-102 (Jan. 1988).

National Semiconductor Corp., LVDS Owner's Manual & Design Guide (Apr. 25, 1997).

National Semiconductor Corp., "DS90CR285/DS90CR286 +3.3V Rising Edge Data Strobe LVDS 28-Bit Channel Link-66 MHZ," (Mar. 1998).

Xilinx, Inc., Virtex 2.5V Field Programmable Gate Arrays Advance Product Specification (Version 1.0) (Oct. 20, 1998).

Xilinx, Inc., Application Note: Using the Virtex Delay-Locked Loop (Version 1.31) (Oct. 21, 1998).

Zaks, R., et al., From Chips to Systems: An Introduction to Microcomputers, pp. 54-61 (Prentice-Hall, Inc., Englewood Cliffs, N.J., 1987).

* cited by examiner

VARIABLE-BANDWIDTH LOOP FILTER METHODS AND APPARATUS

BACKGROUND OF THE INVENTION

This invention relates to loop circuitry. More particularly, this invention relates to providing a variable-bandwidth loop filter in loop circuitry.

Integrated circuit ("ICs") often require relatively accurate high-speed clock signals to facilitate synchronized operation. One way of providing relatively accurate clock signals is to provide phase-locked loop ("PLL") or delay-locked loop ("DLL") circuitry on the IC. Although the discussion herein focuses mainly on PLL circuitry, it will be noted that concepts of the invention could also be extended to DLL circuitry without deviating from the spirit or scope of the invention. As used herein, ICs can include programmable logic devices ("PLDs"), application-specific integrated circuits ("ASICs"), or circuits having characteristics of both PLDs and ASICs.

A basic PLL can include a phase-frequency detector ("PFD"), a charge pump, a loop filter, and a voltage-controlled oscillator ("VCO") connected in series. An input reference signal can be fed to one input of the PFD. The output clock signal of the VCO, which can serve as the output signal of the PLL, can also be fed back to a second input of the PFD. If the feedback clock signal is not locked to the reference signal, then the PFD can output a signal whose voltage polarity is indicative of whether the feedback clock signal leads or lags the reference signal. Furthermore, the magnitude of that signal can be indicative of the amount of the lead or lag. That signal can be filtered by the charge pump and loop filter and input to the VCO, causing the frequency and phase of the output clock signal to change.

Under such operation, the output clock signal can eventually lock to the phase of the reference signal. In this simple example, the output signal can also lock to the frequency of the input reference signal, but in most PLLs, counters/dividers on the input and output of the PLL can be used to divide the frequency of the output clock signal, while a counter/divider in the feedback loop can be used to multiply the frequency of the output clock signal. Thus, the frequency of the output clock signal can often be a rational multiple of the frequency of the input reference signal.

The operation of a DLL can be similar to that of a PLL. A basic DLL can include a phase detector ("PD"), a charge pump, a loop filter, and a voltage-controlled delay line ("VCDL") connected in series. The input reference signal can be fed to one input of the PD. An output of the VCDL can also be fed back to a second input of the PD. If the phase of the feedback clock signal is not locked to that of the reference signal, then the PD can output a voltage signal whose magnitude is indicative of the amount of the phase difference. That signal can be filtered by the charge pump and loop filter and input to the VCDL, thereby altering its phase delay. Eventually, the phase of the output clock signal can lock to the phase of the reference signal. Unlike PLLs, DLLs generally do not affect the frequency of the signal; the output frequency will automatically match the input frequency.

In some cases, a PLL can support the use of both a PD and a PFD. For instance, a PLL might be used to perform clock data recovery ("CDR") using a PD, and to generate a transmission clock signal using a PFD. In such cases, the PLL can also include two loop filters, one for use with the PD and one for use with the PFD. The two loop filters can be designed to match the individual bandwidth requirements associated with the PD or the PFD. Unfortunately, utilizing multiple loop filters in a single PLL can consume a relatively large amount of area and impose relatively difficult design requirements.

In view of the foregoing, it would be desirable to provide methods and apparatus for varying the bandwidth of a single loop filter in a loop circuit. In addition, it would be desirable to provide such methods and apparatus while consuming a relatively small amount of area.

SUMMARY OF THE INVENTION

In accordance with the invention, methods and apparatus are provided for varying the bandwidth of a single loop filter in a loop circuit. In one embodiment of the invention, a loop filter can include first resistor circuitry, second resistor circuitry, and capacitor circuitry. The first resistor circuitry can be coupled to an output of the loop filter through switching circuitry when a first mode of the switching circuitry is activated. Similarly, the second resistor circuitry can be coupled to the output of the loop filter when a second mode of the switching circuitry is activated. The capacitor circuitry can be coupled to both the first and second resistor circuitries.

In another embodiment of the invention, a loop circuit (e.g., a phase-locked loop circuit) can include phase detector circuitry, phase-frequency detector circuitry, charge pump circuitry, filter circuitry, and oscillator circuitry. Both the phase detector circuitry and the phase-frequency detector circuitry can receive a reference signal and a feedback clock signal. The charge pump circuitry can be coupled to either the phase detector circuitry or the phase-frequency detector circuitry, responsive to selection of a mode of operation.

The filter circuitry can include capacitor circuitry and first and second resistor circuitries coupled to the capacitor circuitry. An output of the filter circuitry can be coupled to one of the resistor circuitries responsive to the selection of the mode of operation. The oscillator circuitry can be coupled to the output of the filter circuitry, and can generate an output clock signal of the loop circuit. The output clock signal can be coupled to the feedback clock signal.

In yet another embodiment of the invention, an output clock signal can be generated. A mode of operation can be selected, in response to which phase detector circuitry or phase-frequency detector circuitry can be coupled to charge pump circuitry. An output of the charge pump circuitry can be coupled to capacitor circuitry through either first resistor circuitry or second resistor circuitry in response to the selecting of the mode of operation.

The invention advantageously provides methods and apparatus for varying the bandwidth of a single loop filter of a loop circuit. The methods and apparatus are provided while consuming a relatively small amount of area.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
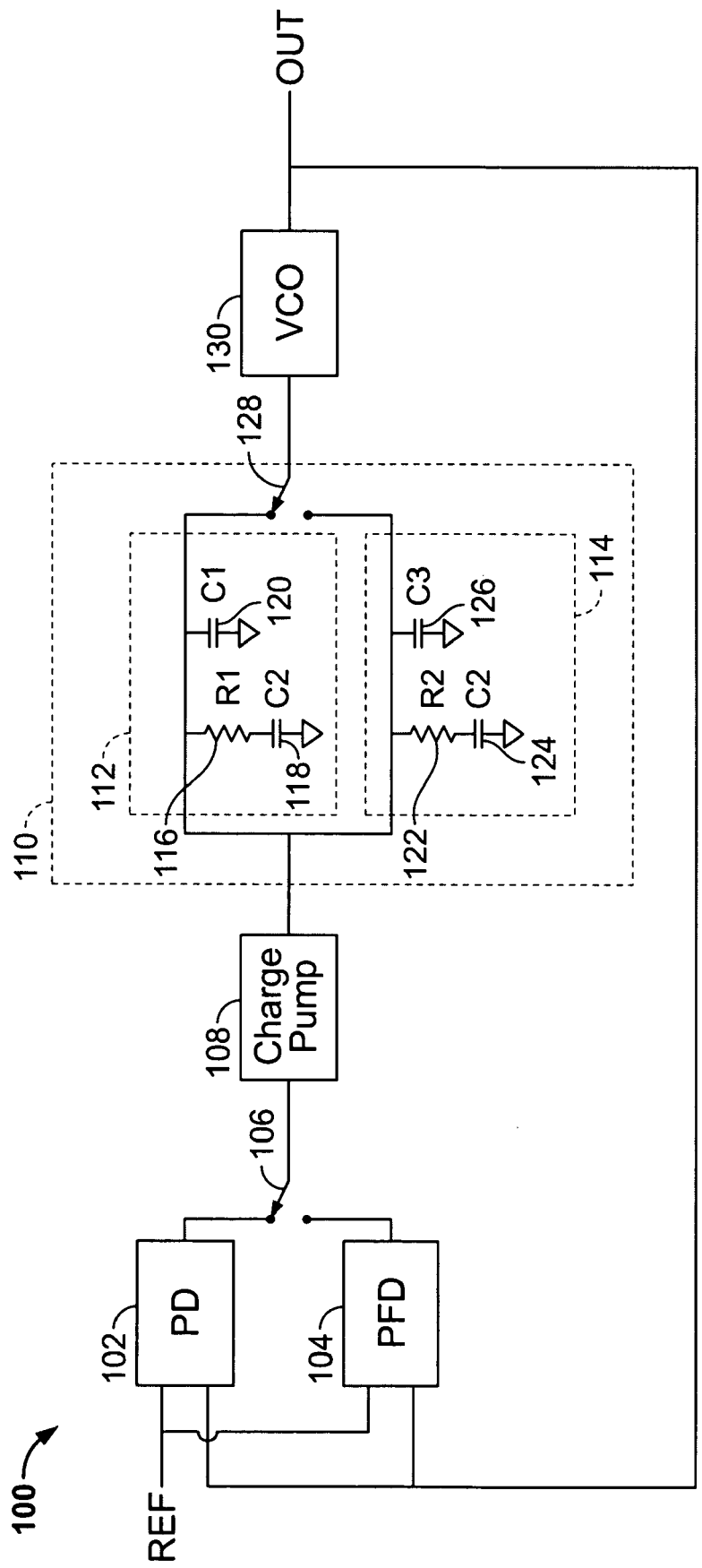
FIG. 1 is a circuit diagram showing known phase-locked loop circuitry with two loop filter circuits.

FIG. 1 is a circuit diagram showing known phase-locked loop ("PLL") circuitry 100 with two loop filter circuits 112 and 114. PLL circuitry 100 can generate an output clock signal OUT that is substantially synchronized in both frequency and phase with reference signal REF.

PLL circuitry 100 can include phase detector ("PD") circuitry 102 and phase-frequency detector ("PFD") circuitry 104, both of which can accept reference signal REF and output clock signal OUT as inputs. PD circuitry 102 can output a signal whose voltage indicates the magnitude of the phase difference between its input signals REF and OUT. In contrast, PFD circuitry 104 can output a signal whose voltage not only indicates the magnitude of the phase difference between its input signals REF and OUT, but also (through the polarity of the signal's voltage) indicates which of the two input signals has a greater frequency.

The output signals of PD circuitry 102 and PFD circuitry 104 can be coupled to switching circuitry 106, which in turn can be coupled to charge pump circuitry 108. If a first mode of operation is selected, switching circuitry 106 can couple the output of PD circuitry 102 to an input of charge pump circuitry 108. If a second mode of operation is selected, switching circuitry 106 can couple the output of PFD circuitry 104 to an input of charge pump circuitry 108. The mode of operation that is selected can depend, for example, on the application for which PLL circuitry 100 is used. For instance, the first mode of operation ("PD mode") might be selected if PLL circuitry is used to perform clock data recovery ("CDR"). In this case, input signal REF could be an incoming data stream, and output signal OUT could be a clock signal that is recovered from the transitions of the incoming data stream. The second mode of operation ("PFD mode") might be selected if PLL circuitry 100 is used to generate a transmission clock signal. In this case, input signal REF could be a reference clock signal (e.g., a relatively clean clock signal derived from a crystal oscillator or other reliable source) and output signal OUT could be a clock signal that is substantially synchronized with input signal REF.

The input signal of charge pump circuitry 108, received from either PD circuitry 102 or PFD circuitry 104, can be filtered by charge pump circuitry 108 and loop filter circuitry 110. The output of loop filter circuitry 110 can be used to control voltage-controlled oscillator ("VCO") circuitry 130. For example, VCO circuitry 130 can be a ring oscillator that includes a plurality of inverter stages coupled together in a closed loop to generate an oscillating clock signal OUT. The output of loop filter circuitry 110 can be used, for example, to vary the delay through each of the inverter stages of VCO 130, thereby varying the frequency and phase of output clock signal OUT.

Loop filter circuitry 110 can include two individual loop filter circuits 112 and 114. Loop filter circuit 112 can include resistor 116 and capacitor 118, coupled in series between the input/output signal of loop filter 112 and a source of relatively low voltage ("VSS"). Resistor 116 can have a resistance of approximately R1, and capacitor 118 can have a capacitance of approximately C2. Loop filter circuit 112 can also include load capacitor 120, coupled between the input/output signal of loop filter 112 and VSS. Load capacitor 120 can have a capacitance of approximately C1.

Loop filter circuit 114 can have a structure that is substantially similar to that of loop filter circuit 112. In particular, loop filter circuit 114 can include resistor 122 and capacitor 124, coupled in series between the input/output signal of loop filter 114 and VSS. Resistor 122 can have a resistance of approximately R2, and capacitor 124 can have a capacitance of approximately C2. Loop filter circuit 114 can also include load capacitor 126, coupled between the input/output signal of loop filter 114 and VSS. Load capacitor 126 can have a capacitance of approximately C3.

Switching circuitry 128 can couple either the output of loop filter circuit 112 or the output of loop filter circuit 114 to VCO 130, depending on the mode of operation that is selected in connection with switching circuitry 106. For example, if PD mode is selected (e.g., because PLL circuitry 100 is being used for CDR), the output of loop filter circuit 112 might be coupled to VCO 130. In such a case, loop filter circuit 112 would preferably have bandwidth characteristics that are relatively well-suited for PD mode. For instance, loop filter circuit 112 might have a relatively small load capacitance C1 and a relatively large resistance R1, yielding a relatively wide bandwidth. This relatively wide bandwidth can be preferable for CDR applications because variations in the incoming data stream can be tracked even when the transitions drift significantly from the expected data rate. In this way, relatively robust jitter tolerance can be achieved.

Similarly, if PFD mode is selected (e.g., because PLL circuitry 100 is being used to generate a transmission clock signal), the output of loop filter circuit 114 might be coupled to VCO 130. In such a case, loop filter circuit 114 would preferably have bandwidth characteristics that are relatively well-suited for PFD mode. For instance, loop filter circuit 114 might have a relatively large load capacitance C3 and a relatively small resistance R2, yielding a relatively narrow bandwidth. This relatively narrow bandwidth can be preferable for transmission clock applications because a relatively wide bandwidth would amplify any jitter that might be present on the reference signal REF, thereby degrading the quality of the transmitted clock signal OUT.

As demonstrated by the foregoing description, a specific loop filter circuit 112 or 114 can be selected depending on the mode of operation of PLL circuitry 100. However, such an architecture can result in relatively complex design requirements and consumption of a relatively large area. Because loop filter circuits 112 and 114 have very similar circuit topologies (in fact, in the example illustrated in FIG. 1, capacitors 118 and 124 even have substantially equal capacitances C2), redundancies exist that could be eliminated by a more compact loop filter design. An example of such a design is illustrated in FIG. 2.

Figure 2:
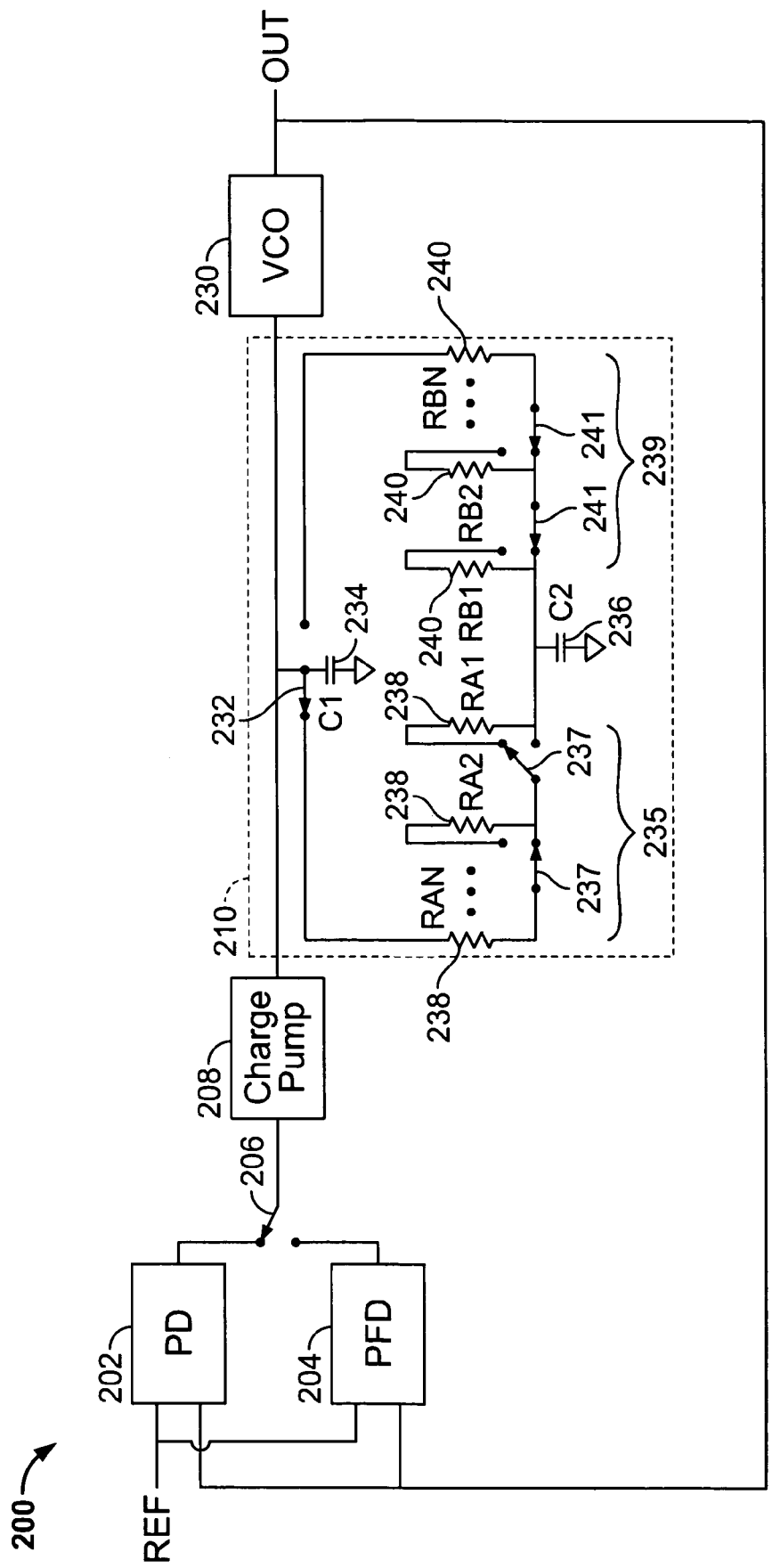
FIG. 2 is a circuit diagram showing illustrative phase-locked loop circuitry with variable-bandwidth loop filter circuitry according to an embodiment of the invention.

FIG. 2 is a circuit diagram showing illustrative PLL circuitry 200 with variable-bandwidth loop filter circuitry 210 according to an embodiment of the invention. PLL circuitry 200 can include PD circuitry 202, PFD circuitry 204, switching circuitry 206, charge pump circuitry 208, loop filter circuitry 210, and VCO circuitry 230. The overall structure and functionality of PLL circuitry 200 can be substantially similar to those of PLL circuitry 100, and it is not deemed necessary to describe all the elements of PLL circuitry 200 in detail. Reference numbers for similar elements differ by 100 between FIGS. 1 and 2.

One key difference between PLL circuitries 200 and 100 is the implementation of their respective loop filter circuitries 210 and 110. Loop filter circuitry 210, in contrast to loop filter circuitry 110, includes only one component loop filter circuit. Loop filter circuitry 210 can include capacitor 234, which can be coupled between the output signal of loop filter circuitry 210 and VSS. In an embodiment of the invention, the capacitance C1 of capacitor 234 can be programmable.

Loop filter circuitry 210 can also include first resistor circuitry 235 and second resistor circuitry 239, which can be coupled to each other and to capacitor 236. Capacitor 236 can in turn be coupled to VSS. In an embodiment of the invention, the capacitance C2 of capacitor 236 can be programmable. First resistor circuitry 235 can be coupled to the output signal of loop filter circuitry 210 through switching circuitry 234 when a first mode of switching circuitry 232 is activated. (As noted in connection with FIG. 1, this mode can correspond to a mode of operation of PLL circuitry 200 generally, and can also determine the operation of switching circuitry 206). Similarly, second resistor circuitry 239 can be coupled to the output signal of loop filter circuitry 210 through switching circuitry 234 when a second mode of switching circuitry 232 is activated.

The resistance of first resistor circuitry 235 is preferably variable. For example, first resistor circuitry 235 can include a plurality of resistors 238, most of which can be selectively coupled in series between switching circuitry 232 and capacitor 236. Resistors 238 can have substantially different resistances, which are denoted in FIG. 2 as RA1, RA2, . . . RAN. Alternatively, resistors 238 can have substantially similar resistances. In the example illustrated in FIG. 2, one resistor 238 (with resistance RAN) is always coupled between switching circuitry 232 and capacitor 236, while each of the remaining resistors 238 can either be coupled in series or bypassed, depending on the mode of the switching circuitry 237 corresponding to that resistor. It should be noted that the modes of switching circuitries 237 are not necessarily related to the modes of switching circuitries 206 and 232. Rather, switching circuitries 237 can simply determine the effective resistance of loop filter circuitry 210 once a mode of operation of PLL circuitry 200 (which varies the mode of switching circuitries 206 and 232) has been determined.

Similarly, second resistor circuitry 239 can include a plurality of resistors 240, most of which can be selectively coupled in series between switching circuitry 232 and capacitor 236 by appropriate operation of individual switching circuitries 241. Resistors 240 can have substantially different resistances, which are denoted in FIG. 2 as RB1, RB2, . . . RBN. Alternatively, resistors 240 can have substantially similar resistances. In the example illustrated in FIG. 2, one resistor 240 (with resistance RBN) is always coupled between switching circuitry 232 and capacitor 236, while each of the remaining resistors 240 can either be coupled in series or bypassed, depending on the mode of the switching circuitry 241 corresponding to that resistor.

Thus, variable-bandwidth loop filter circuitry can be provided in accordance with the invention by varying the resistance, the capacitance, or both of loop filter circuitry 210 as required by the mode of operation of PLL circuitry 200. The complexity and area of loop filter circuitry 210 can be substantially less than those of known loop filter circuitry 110. At the same time, the bandwidth and stability of loop filter circuitry 210 can still be varied according to the specifications of the applications for which PLL circuitry 200 is used.

As described in connection with FIG. 1, switching circuitries 206 and 232 can support multiple modes of operation. For example, if PD mode is selected (e.g., because PLL circuitry 200 is being used for CDR), an output of first resistor circuitry 235 might be coupled to VCO 230. In such a case, loop filter circuit 210 would preferably have bandwidth characteristics that are relatively well-suited for PD mode. For instance, loop filter circuit 210 might have a relatively small load capacitance C1 (which, as mentioned above, can be programmable) and a relatively large resistance determined by appropriate setting of switching circuitries 237, yielding a relatively wide bandwidth. This relatively wide bandwidth can be preferable for CDR applications because variations in the incoming data stream can be tracked even when the transitions drift significantly from the expected data rate. In this way, relatively robust jitter tolerance can be achieved.

Similarly, if PFD mode is selected (e.g., because PLL circuitry 200 is being used to generate a transmission clock signal), an output of second resistor circuitry 239 might be coupled to VCO 230. In such a case, loop filter circuit 210 would preferably have bandwidth characteristics that are relatively well-suited for PFD mode. For instance, loop filter circuitry 210 might have a relatively large load capacitance C1 (which, as mentioned above, can be programmable) and a relatively small resistance determined by appropriate setting of switching circuitries 241, yielding a relatively narrow bandwidth. This relatively narrow bandwidth can be preferable for transmission clock applications because a relatively wide bandwidth would amplify any jitter that might be present on the reference signal REF, thereby degrading the quality of the transmitted clock signal OUT.

It will be noted that aspects of the invention described above in connection with FIGS. 1 and 2 were described for purposes of illustration and not of limitation. For example, resistor circuitries 235 and 239 could include resistors that can be selectively coupled in parallel, instead of in series. In addition, other circuitry whose resistance is known, or whose resistance can be varied, could be used. Switching circuitries 206, 232, 237, and 241 could include any suitable switching circuitry, including any combination of transistor circuitry, multiplexing circuitry, or logic gates.

In addition, although the invention was described above in connection with two modes of operation, corresponding to the use of PD circuitry and PFD circuitry, respectively, any suitable modes could be used. For instance, loop filter circuitry 210 could be used with only one of PD circuitry 202 or PFD circuitry 204. Similarly, loop filter circuitry 210 could be used with more than two different modes of operation, depending on the requirements of the applications for which PLL circuitry 200 is used.

Although loop circuitry 210 was illustrated chiefly in the context of PLL circuitry 200, it will be understood that concepts of the invention could be applied to delay-locked loop ("DLL") circuitry, other timing circuitry, or any other circuitry for which variable-bandwidth filter circuitry would be beneficial. Likewise, the structure of PLL circuitry 200 could also be varied. For example, charge pump circuitry 208 could be replaced with other appropriate circuitry, integrated at least partly into loop filter circuitry 210, omitted altogether, or any suitable combination thereof. Similarly, additional circuitry could be added to PLL circuitry 200, such as counter/divider circuitry to vary the frequency of output clock signal OUT, multiplexer or other delay circuitry to vary the phase of output clock signal OUT, or any other appropriate circuitry.

Figure 3:
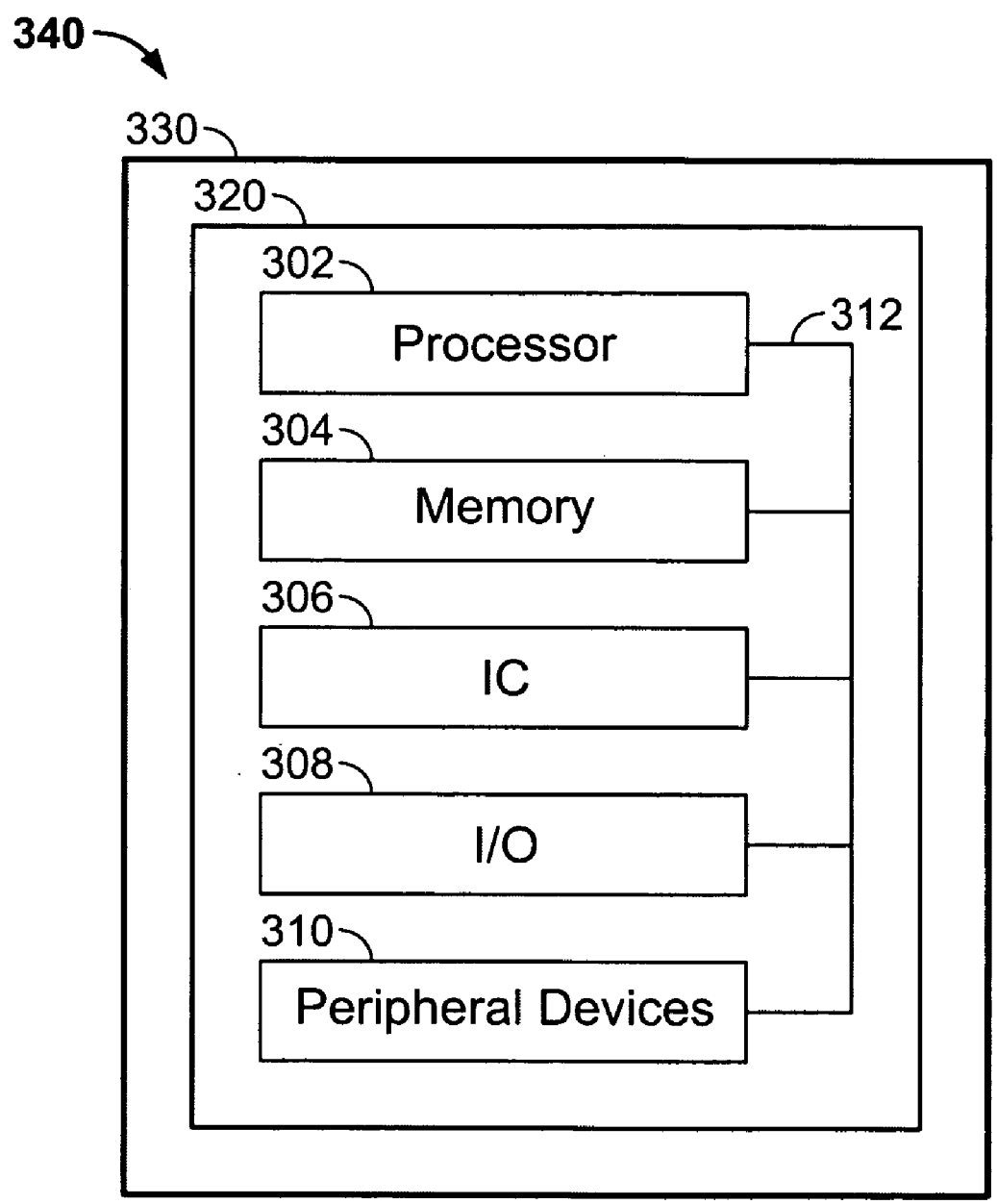
FIG. 3 is a block diagram of a data processing system incorporating the invention.

FIG. 3 illustrates an integrated circuit ("IC") 306, which incorporates loop circuitry with variable-bandwidth loop filter circuitry in accordance with this invention, in a data processing system 340. IC 306 may be a programmable logic device ("PLD"), an application-specific IC ("ASIC"), or a device possessing characteristics of both a PLD and an ASIC. Data processing system 340 may include one or more of the following components: processor 302; memory 304; I/O circuitry 308; and peripheral devices 310. These components are coupled together by a system bus 312 and are populated on a circuit board 320 which is contained in an end-user system 330.

System 340 can be used in a wide variety of applications, such as computer networking, data networking, instrumentation, video processing, or digital signal processing. IC 306 can be used to perform a variety of different logic functions. For example, IC 306 can be configured as a processor or controller that works in cooperation with processor 302. IC 306 may also be used as an arbiter for arbitrating access to a shared resource in system 340. In yet another example, IC 306 can be configured as an interface between processor 302 and one of the other components in system 340.

Thus it is seen that methods and apparatus are provided for varying the bandwidth of a loop filter. One skilled in the art will appreciate that the invention can be practiced by other than the described embodiments, which are presented for purposes of illustration and not of limitation, and the present invention is limited only by the claims which follow.

What is claimed is:

1. A loop circuit comprising a filter circuit comprising:
   first resistor circuitry that can be coupled to an output of said filter circuit through switching circuitry when a first mode of said switching circuitry is activated;
   second resistor circuitry coupled to said first resistor circuitry, wherein said second resistor circuitry can be coupled to said output of said filter circuit through said switching circuitry when a second mode of said switching circuitry is activated;
   first capacitor circuitry coupled to said first and second resistor circuitries; and
   second capacitor circuitry coupled to said output of said filter circuit, wherein a capacitance of said second capacitor circuitry is programmable, wherein:
   said first resistor circuitry comprises a first plurality of resistors; and
   each resistor of said first plurality of resistors can either be coupled in series with said first capacitor circuitry or bypassed;
   phase detector circuitry that can be coupled to said filter circuit when said first mode of said switching circuitry is activated; and
   phase-frequency detector circuitry that can be coupled to said filter circuit when said second mode of said switching circuitry is activated.

2. The filter circuit of claim 1 wherein said first capacitor circuitry is coupled to a source of voltage.

3. The filter circuit of claim 1 wherein said second resistor circuitry comprises a second plurality of resistors, wherein each resistor of said second plurality of resistors can either be coupled in series with said first capacitor circuitry or bypassed.

4. A loop circuit comprising the filter circuit of claim 1.

5. The loop circuit of claim 4, wherein said loop circuit comprises:
   phase detector circuitry that can be coupled to said filter circuit when said first mode of said switching circuitry is activated; and
   phase-frequency detector circuitry that can be coupled to said filter circuit when said second mode of said switching circuitry is activated.

6. A programmable logic device comprising the loop circuit of claim 4.

7. A data processing system comprising the programmable logic device of claim 6.

8. A loop circuit comprising:
   phase detector circuitry for receiving a reference signal and a feedback clock signal;
   phase-frequency detector circuitry for receiving said reference signal and said feedback clock signal;
   charge pump circuitry that can be coupled to either said phase detector circuitry or said phase-frequency detector circuitry responsive to selection of a mode of operation;
   filter circuitry coupled to said charge pump circuitry, wherein said filter circuitry comprises:
   first capacitor circuitry;
   first and second resistor circuitries coupled to said first capacitor circuitry, wherein:
   an output of said filter circuitry can be coupled to one of said resistor circuitries responsive to said selection of said mode of operation;
   said first resistor circuitry comprises a first plurality of resistors; and
   each resistor of said first plurality of resistors can either be coupled in series with said first capacitor circuitry or bypassed;
   second capacitor circuitry coupled to said output of said filter circuitry; and
   oscillator circuitry, coupled to said output of said filter circuitry, for generating an output clock signal of said loop circuit, wherein said output clock signal is coupled to said feedback clock signal and wherein a capacitance of said second capacitor circuitry is programmable.

9. The loop circuit of claim 8 wherein:
   said oscillator circuitry comprises voltage-controlled oscillator circuitry; and
   said output of said filter circuitry can determine, at least in part, a frequency of said output clock signal.

10. The loop circuit of claim 8 wherein said first capacitor circuitry is coupled to a source of voltage.

11. The loop circuit of claim 8 wherein said second resistor circuitry comprises a second plurality of resistors, wherein each resistor of said second plurality of resistors can either be coupled in series with said first capacitor circuitry or bypassed.

12. A programmable logic device comprising the loop circuit of claim 8.

13. A data processing system comprising the programmable logic device of claim 12.

14. A method of generating an output clock signal, said method comprising:
   selecting a mode of operation;
   coupling either phase detector circuitry or phase-frequency detector circuitry to charge pump circuitry in response to said selecting said mode of operation;
   coupling an output of said charge pump circuitry to capacitor circuitry through either first resistor circuitry or second resistor circuitry in response to said selecting said mode of operation;
   programming a capacitance of said capacitor circuitry; and
   setting a resistance of said first resistor circuitry, wherein said setting said resistance comprises selectively coupling in series to said capacitor circuitry at least one of a plurality of resistors of said first resistor circuitry.

15. The method of claim 14 further comprising:
   receiving said output of said charge pump circuitry at oscillator circuitry; and
   determining, at least in part, operation of said oscillator circuitry in response to said receiving said output of said charge pump circuitry.

16. The method of claim 15 wherein said determining comprises setting a frequency of an output signal of said oscillator circuitry.

* * * * *